(12) United States Patent
Johnston et al.

(10) Patent No.: US 12,363,825 B2
(45) Date of Patent: Jul. 15, 2025

(54) PATTERNED CONDUCTIVE ARTICLE

(71) Applicant: 3M INNOVATIVE PROPERTIES COMPANY, St. Paul, MN (US)

(72) Inventors: Raymond P. Johnston, Lake Elmo, MN (US); Kevin W. Gotrik, Hudson, WI (US); John J. Sullivan, Hudson, WI (US); Kenneth A. P. Meyer, Eagan, MN (US); Joseph C. Carls, Austin, TX (US); Haiyan Zhang, Lake Elmo, MN (US); Gregory L. Abraham, Austin, TX (US); Matthew S. Stay, Bloomington, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 18/663,314

(22) Filed: May 14, 2024

(65) Prior Publication Data

US 2024/0306290 A1   Sep. 12, 2024

Related U.S. Application Data

(63) Continuation of application No. 17/602,886, filed as application No. PCT/IB2020/054264 on May 5, 2020, now Pat. No. 12,048,092.
(Continued)

(51) Int. Cl.
*H05K 1/02* (2006.01)
*H01Q 1/38* (2006.01)
(Continued)

(52) U.S. Cl.
CPC ............ *H05K 1/0296* (2013.01); *H01Q 1/38* (2013.01); *H05K 1/0353* (2013.01);
(Continued)

(58) Field of Classification Search
None
See application file for complete search history.

(56) References Cited

U.S. PATENT DOCUMENTS

| 4,990,827 A | 2/1991 | Ehrfeld et al. |
| 6,049,976 A | 4/2000 | Khandros |

(Continued)

FOREIGN PATENT DOCUMENTS

| CN | 1677744 A | 10/2005 |
| CN | 102063951 B | 7/2013 |

(Continued)

OTHER PUBLICATIONS

JP 2015122385 A (Year: 2024).*
(Continued)

*Primary Examiner* — Timothy J Thompson
*Assistant Examiner* — John B Freal
(74) *Attorney, Agent, or Firm* — Clifton F. Richardson

(57) ABSTRACT

A patterned conductive article includes a substrate having a first groove therein; a conductive seed layer disposed in the first groove; and a unitary conductive body disposed at least partially in the first groove. The conductive seed layer covers at least a majority of a bottom surface of the first groove, and the unitary conductive body covers the conductive seed layer and at least a majority of side surfaces of the first groove. In a plane through the unitary conductive body that is parallel to and separate from the conductive seed layer, the unitary conductive body has a lower first line edge roughness at a first interface with the side surfaces and the conductive seed layer has a higher second line edge roughness at an edge of the conductive seed layer.

18 Claims, 9 Drawing Sheets

Related U.S. Application Data

(60) Provisional application No. 62/843,739, filed on May 6, 2019.

(51) Int. Cl.
  *H05K 1/03* (2006.01)
  *H05K 3/00* (2006.01)
  *H05K 3/10* (2006.01)
  *H05K 3/20* (2006.01)
  *H05K 3/24* (2006.01)
  *H05K 3/46* (2006.01)

(52) U.S. Cl.
  CPC .......... *H05K 3/0014* (2013.01); *H05K 3/103* (2013.01); *H05K 3/207* (2013.01); *H05K 3/244* (2013.01); *H05K 3/4644* (2013.01); *H05K 2201/09118* (2013.01); *H05K 2203/0108* (2013.01); *H05K 2203/0152* (2013.01); *H05K 2203/0156* (2013.01); *H05K 2203/0723* (2013.01)

(56) References Cited

U.S. PATENT DOCUMENTS

| | | | |
|---|---|---|---|
| 6,136,182 | A | 10/2000 | Dolan et al. |
| 6,400,018 | B2 | 6/2002 | Clatanoff et al. |
| 6,531,332 | B1 | 3/2003 | Shkel et al. |
| 6,929,849 | B2 | 8/2005 | Koskenmaki et al. |
| 7,018,713 | B2 | 3/2006 | Padiyath et al. |
| 7,233,296 | B2 | 6/2007 | Song et al. |
| 7,306,158 | B2 | 12/2007 | Berardi et al. |
| 7,324,061 | B1 | 1/2008 | Hadley |
| 8,179,381 | B2 | 5/2012 | Frey et al. |
| 8,274,494 | B2 | 9/2012 | Frey et al. |
| 8,658,248 | B2 | 2/2014 | Anderson et al. |
| 8,906,491 | B2 | 12/2014 | Staub |
| 8,970,515 | B2 | 3/2015 | Moran et al. |
| 9,105,867 | B2 | 8/2015 | Verschuuren et al. |
| 9,500,888 | B2 | 11/2016 | Schwartz et al. |
| 9,780,438 | B2 | 10/2017 | Kuehler et al. |
| 2002/0012248 | A1 | 1/2002 | Campbell et al. |
| 2005/0058951 | A1 | 3/2005 | Sugimura et al. |
| 2005/0067286 | A1 | 3/2005 | Ahn et al. |
| 2005/0079333 | A1 | 4/2005 | Wheatley et al. |
| 2006/0087602 | A1 | 4/2006 | Kunisada et al. |
| 2007/0160811 | A1 | 7/2007 | Gaides et al. |
| 2008/0095988 | A1 | 4/2008 | Frey et al. |
| 2009/0051620 | A1 | 2/2009 | Ishibashi et al. |
| 2009/0219257 | A1* | 9/2009 | Frey ..................... G06F 3/045 178/18.05 |
| 2009/0236627 | A1 | 9/2009 | Kim et al. |
| 2009/0303125 | A1 | 12/2009 | Caille et al. |
| 2010/0270057 | A1 | 10/2010 | Yanagimoto et al. |
| 2010/0316852 | A1 | 12/2010 | Condo et al. |
| 2011/0278569 | A1 | 11/2011 | Viswanadam |
| 2012/0033367 | A1 | 2/2012 | Jones et al. |
| 2013/0264390 | A1 | 10/2013 | Frey et al. |
| 2013/0277330 | A1 | 10/2013 | Zu |
| 2014/0057058 | A1 | 2/2014 | Yapel et al. |
| 2014/0198264 | A1 | 7/2014 | Gao et al. |
| 2014/0204294 | A1 | 7/2014 | Lv |
| 2014/0205810 | A1 | 7/2014 | Trauernicht et al. |
| 2014/0308477 | A1 | 10/2014 | Derks et al. |
| 2015/0041203 | A1 | 2/2015 | Lebens et al. |
| 2015/0085460 | A1 | 3/2015 | Frey |
| 2015/0109674 | A1 | 4/2015 | Cok |
| 2015/0138151 | A1 | 5/2015 | Moran et al. |
| 2015/0279688 | A1 | 10/2015 | Cok et al. |
| 2015/0285956 | A1 | 10/2015 | Schmidt et al. |
| 2015/0339567 | A1 | 11/2015 | Hirasaki et al. |
| 2016/0004358 | A1 | 1/2016 | Frey |
| 2016/0066420 | A1 | 3/2016 | Cok et al. |
| 2016/0170101 | A1 | 6/2016 | Kivel et al. |
| 2017/0248741 | A1 | 8/2017 | Hao et al. |

FOREIGN PATENT DOCUMENTS

| | | | | |
|---|---|---|---|---|
| CN | 106374197 | B | 6/2023 | |
| EP | 2124514 | A | 11/2009 | |
| EP | 3057103 | A1 | 8/2016 | |
| JP | 2003209421 | A | 7/2003 | |
| JP | 2006287729 | A | 10/2006 | |
| JP | 2009151062 | A | 7/2009 | |
| JP | 2012019205 | A | 1/2012 | |
| JP | 2015122385 | A * | 7/2015 | ........... H01L 23/145 |
| WO | 2006106759 | A1 | 10/2006 | |
| WO | WO-2006106982 | A1 * | 10/2006 | ............ H01Q 1/243 |
| WO | 2008047953 | A1 | 4/2008 | |
| WO | 2014063417 | A1 | 5/2014 | |
| WO | 2014153898 | A1 | 10/2014 | |
| WO | 2017145706 | A1 | 8/2017 | |
| WO | 2018178802 | A1 | 10/2018 | |
| WO | 2018178803 | A1 | 10/2018 | |

OTHER PUBLICATIONS

WO 2006106982 A1 (Year: 2024).*
International Search Report for PCT International Application No. PCT/IB2020/054264, mailed on Sep. 24, 2020, 6 pages.
Li, "The Rise of Conductive Copper Inks: Challenges and Perspectives", Applied Materials Today, 2019, pp. 1-26.

* cited by examiner

PATTERNED CONDUCTIVE ARTICLE

CROSS REFERENCE TO RELATED APPLICATIONS

This application is a continuation of U.S. application Ser. No. 17/602,886, filed Oct. 11, 2021, now allowed, which is a US 371 Application based on PCT/IB2020/054264, filed on May 5, 2020, which claims the benefit of U.S. Provisional Application No. 62/843,739, filed May 6, 2019, the disclosures of which are incorporated by reference in their entireties herein.

BACKGROUND

An article useful as an antenna, EMI shield, or touch sensor may include a micropattern of conductive traces formed on a substrate by photolithography.

SUMMARY

In some aspects of the present description, a patterned conductive article including a substrate including a unitary layer and including a micropattern of conductive traces embedded at least partially in the unitary layer is provided. Each conductive trace extends along a longitudinal direction of the conductive trace and includes a conductive seed layer having a top major surface and an opposite bottom major surface in direct contact with the unitary layer, and a unitary conductive body disposed on the top major surface of the conductive seed layer. The unitary conductive body and the conductive seed layer differ in at least one of composition or crystal morphology. The unitary conductive body has lateral sidewalls and at least a majority of a total area of the lateral sidewalls is in direct contact with the unitary layer.

In some aspects of the present description, a patterned conductive article is provided. The patterned conductive article includes a substrate having a first groove therein, a conductive seed layer disposed in the first groove, and a unitary conductive body disposed at least partially in the first groove. The first groove extends along a longitudinal direction and has a bottom surface and side surfaces. In at least one cross-section of the first groove perpendicular to the longitudinal direction, the conductive seed layer covers at least a majority of the bottom surface of the first groove, and the unitary conductive body covers the conductive seed layer and at least a majority of the side surfaces of the first groove. Each of the side surfaces and the unitary conductive body defines a conductor-insulator interface therebetween. The unitary conductive body and the conductive seed layer define a conductor-conductor interface therebetween.

In some aspects of the present description, a patterned conductive article including a substrate having a first groove therein, a conductive seed layer disposed in the first groove, and a unitary conductive body disposed at least partially in the first groove. The first groove has a bottom surface and side surfaces. The conductive seed layer covers at least a majority of the bottom surface of the first groove, and the unitary conductive body covers the conductive seed layer and at least a majority of the side surfaces of the first groove. In a plane through the unitary conductive body that is parallel to and spaced apart from the seed layer, the unitary conductive body has a lower first line edge roughness at a first interface with the side surfaces, and the conductive seed layer has a higher second line edge roughness at an edge of the conductive seed layer.

In some aspects of the present description, a process of making a patterned conductive article is provided. The process includes providing a tool having at least one ridge; disposing a conductive layer on a top surface of a first portion of the at least one ridge such that at least a majority of a total area of side surfaces of the first portion of the at least one ridge is free of the conductive layer; disposing a resin onto the tool after the disposing the conductive layer step; solidifying the resin to form a polymeric layer including at least one groove corresponding to the at least one ridge; and removing the polymeric layer and the conductive layer from the tool such that the conductive layer is disposed at a bottom surface of the at least one groove. In some embodiments, the method further includes depositing conductive material (e.g., via electroplating) into the at least one groove such that the conductive material covers the conductive layer. The deposited conductive material may form a unitary conductive body.

DETAILED DESCRIPTION

Figure 1:
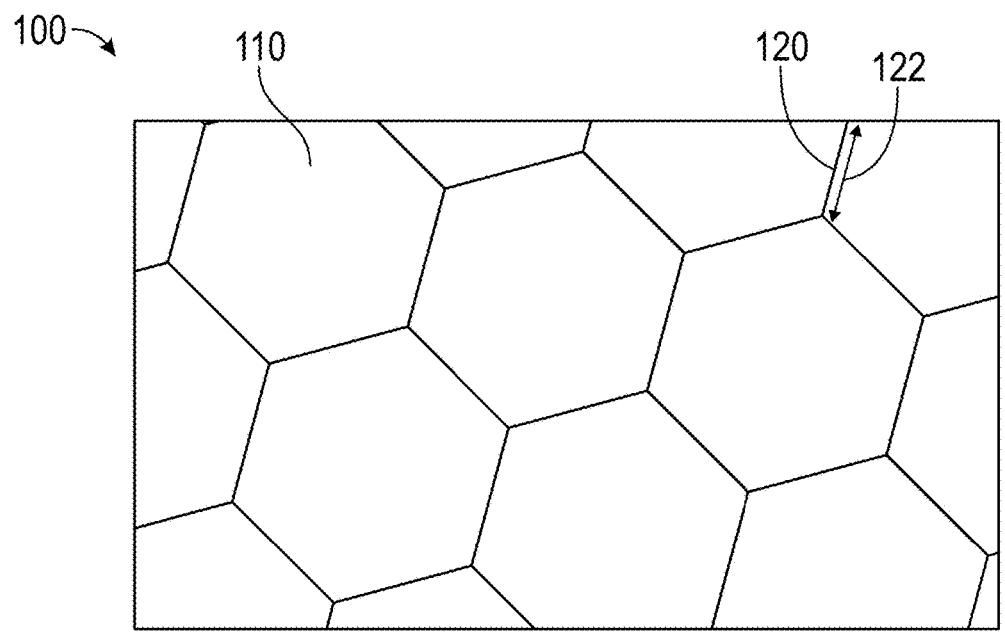
FIG. 1 is a schematic top plan view of a patterned conductive article.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Micropatterns of conductive traces may be formed on a substrate using photolithography processes. According to some aspects of the present description, processes have been developed which allow conductive traces to be formed at least partially within a substrate without utilizing photolithography. In some embodiments, the processes described herein are less expensive and/or more easily implemented than traditional photolithography processes. In some embodiments, the processes allow traces having a large (e.g., at least 0.8) aspect ratio (thickness divided by width) to be formed. A large aspect ratio may be desired for applications where a high transparency and a high electrical conductance is desired. For example, increasing the open area fraction can increase the transparency but would lower the electrical conductance for a fixed trace thickness. The traces can then made thicker to increase the electrical conductance, which can lead a high aspect ratio. In some embodiments, the patterned conductive article may be used at relatively high operating frequencies (e.g., the patterned conductive article may be an antenna designed to operate at microwave frequencies) where the skin depth of the material of the traces is smaller than the width of the traces, for example. Using a high aspect ratio increases the surface area of the traces for a given trace width and this increases the conductor usage (and therefore increases the electrical conductance at the operating frequencies) compared to lower aspect ratio traces (e.g., those conventionally formed by lithography or printing) of the same trace width. In some embodiments, the traces are formed by plating on a conductive layer (e.g., electroplating on a conductive seed layer) disposed on bottoms of grooves in a substrate. The sidewalls of the grooves may be free of or substantially free of the conductive seed layer. Plating onto a conductive seed layer disposed on the bottom, but not on the sidewalls, of the groove has been found to provide improved control over the trace profile compared to plating into a groove where the seed layer is also on the side walls. For example, if the seed layer were on the sidewalls, plating can result in metal being formed on upper portions of the seed layer on the side walls which can result in spill-over of the metal on the top surface of the substrate past the edge of the groove. Such spill-over can be problematic for patterned articles made by traditional processes, especially when a high aspect ratio is desired since this can lower the optical transmission through the patterned article.

In addition, placing the conductive layer at the bottom of the grooves provides protection (e.g., improved durability) of the conductive layer. For some applications, a high conductance may not be needed, and so no conductive body is plated onto the conductive layer, in some embodiments. In some such embodiments, a nonmetallic material may be disposed in the grooves on the conductive layer. For example, one or more of an adhesive, a polymer, or a dielectric material (e.g., a polymeric optically clear adhesive) may be backfilled into the grooves over the conductive layer.

A conductive member (e.g., body, layer, trace, or material) means an electrically conductive member, unless indicated otherwise. A conductive member may have an electrical resistivity less than 1 ohm·m, or less than 0.01 ohm·m, or less than $10^{-4}$ ohm·m, or less than $10^{-6}$ ohm·m, for example. Non-conductive material refers to electrically non-conductive material, unless indicated differently. A non-conductive material may have an electrical resistivity greater than 100 ohm·m, or greater than $10^4$ ohm·m, or greater than $10^6$ ohm·m, or greater than $10^8$ ohm·m, for example. Electrical resistivity refers to the direct current (DC) resistivity, unless indicated differently.

FIG. 1 is a schematic top plan view of a patterned conductive article 100 or a portion of the article 100. The article 100 includes a substrate 110 and a micropattern of conductive traces 120 embedded at least partially in the substrate 110. Each conductive trace 120 extends along a longitudinal direction 122 of the conductive trace 120. Each conductive trace 120 may have a length along the longitudinal direction 122 and a width along an orthogonal direction where the width is substantially smaller than the length. In some embodiments, the substrate 110 is unitary or includes a unitary layer. For example, the substrate 110 may be a monolithic polymeric substrate or may include a monolithic polymeric first layer disposed on a second layer of the substrate.

In some embodiments, the substrate 110 is substantially transparent. In some embodiments, the patterned conductive article 100 is substantially transparent. For example, the article 100 can be substantially transparent when the article 100 has an open area fraction (portion or percentage of area not covered by a trace in a top plan view of the article 100) that is sufficiently high. In some embodiments, the article 100 has an open area fraction in a range of 80% to 99.95%, or 80% to 99.9%, or 85% to 99.9%, or 90% to 99.9%, or 95% to 99.9%. In some embodiments, in a top plan view, a total area of the pattern of conductive traces 120 is less than 50%, or less than 20%, or less than 10%, or less than 5%, or less than 3%, or less than 2%, or less than 1% of a total surface area of the patterned conductive article 100. In some embodiments, the article 100 an average optical transmittance for normally incident visible light (wavelengths in a range of 400 nm to 700 nm) of at least 50%, or at least 70%, or at least 80%, or at least 90%. In some embodiments, the average optical transmittance may be less than 70% or less than 50%. For example, the article 100 may include additional layer(s) such as a decorative film (e.g., a FASARA window film available from 3M Company, St. Paul, MN) which reduces the average optical transmittance. The optical transmittance may be measured from a top or a bottom major surface of the article 100. In some embodiments, the average optical transmittance of the substrate with the conductive traces differs from the average optical transmittance of the substrate without the conductive traces by no more than 5%, or no more than 2%, or no more than 1%.

In some embodiments, the article 100 is a flexible film (e.g., bendable 180 degrees around a cylinder having a diameter of 10 cm without cracking). The flexible film may be substantially transparent as described elsewhere.

In some embodiments, the article 100 is at least one of an antenna, a heater, an electromagnetic interference (EMI) shield, an electrostatic dissipation component, or an electrode. In some embodiments, the article 100 is an antenna as described further elsewhere herein. In some embodiments, the article 100 is a sensor such as a touch sensor. In some embodiments, the antenna, heater, electromagnetic interference shield, electrostatic dissipation component, sensor, or electrode, is substantially transparent and/or is a flexible film.

The micropattern of conductive traces 120 may be or include a mesh pattern which may be a two-dimensional regular array (e.g., a rectangular, square, triangular, or hexagonal array) or a two-dimensional irregular array of the traces. Suitable micropattern geometries for the article 100 include those described in U.S. Pat. Appl. Publ. Nos. 2008/0095988 (Frey et al.), 2009/0219257 (Frey et al.), 2015/0138151 (Moran et al.), 2013/0264390 (Frey et al.), and 2015/0085460 (Frey), for example.

In some embodiments, each trace 120 is disposed at least partially in a groove in the substrate 110. A trace that is disposed at least partially in a substrate is schematically illustrated in FIG. 2.

Figure 2:
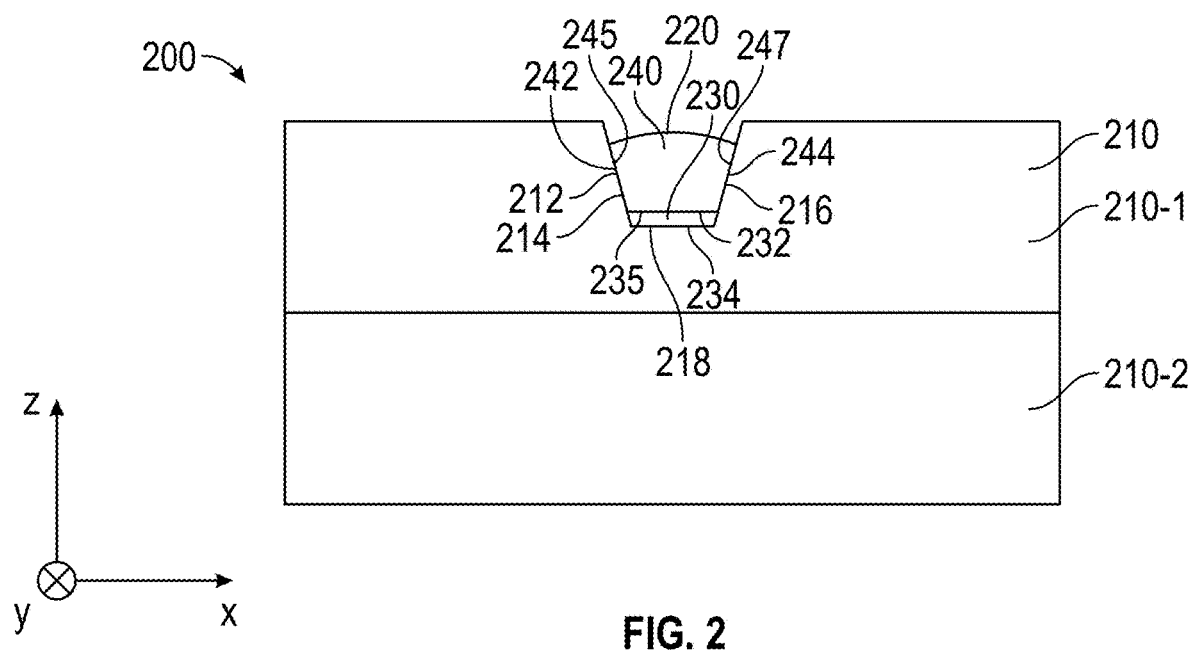
FIGS. 2-3 are schematic cross-sectional views of portions of patterned conductive articles.

FIG. 2 is a schematic cross-sectional view of a portion of a patterned conductive article 200 including a substrate 210 and a trace 220 at least partially embedded in the substrate 210. In the illustrated embodiment, the substrate 210 includes a layer 210-1 disposed on a layer 210-2. In some embodiments, the layer 210-1 is a unitary layer. In such embodiments, the layer 210-1 may be considered to be a first unitary substrate which is disposed on a second substrate (layer 210-2). In some embodiments, the layer 210-2 is a unitary layer. In some embodiments, layer 210-1 may be formed by casting and curing a resin onto the layer 210-2.

In some embodiments, the substrate 210 is substantially transparent and/or polymeric. The trace 220 may be a trace in a micropattern of conductive traces. The trace 220 includes a conductive seed layer 230 having a top major surface 232 and an opposite bottom major surface 234 in direct contact with the substrate 210 (e.g., in direct contact with a unitary layer 210-1 of the substrate 210). The trace 220 further includes a unitary conductive body 240 disposed on the top major surface 232 of the conductive seed layer 230. The conductive seed layer 230 may be or include a cured conductive ink or a cured conductive coating, for example, or may be or include a transferred layer (e.g., a transferred metal layer), for example. The unitary conductive body 240 may be a metal body formed by plating, for example. In some embodiments, the unitary conductive body 240 and the conductive seed layer 230 differ in at least one of composition or crystal morphology. The unitary conductive body 240 has lateral sidewalls 242 and 244. In some embodiments, at least a majority (or at least 60%, or at least 70%, or at least 80%, or at least 90%) of a total area of the lateral sidewalls 242 and 242 is in direct contact with the layer 210-1.

The patterned conductive article 200 may alternatively or in addition be described as follows. The patterned conductive article 200 includes a substrate 210 including a first groove 212 therein. For example, the substrate 210 may include a micropattern of grooves therein (see, e.g., FIG. 1) where the micropattern of grooves includes the first groove 212. In some embodiments, the first groove 212 extends along a longitudinal direction (y-direction of the illustrated x-y-z coordinate system) of the first groove 212 and has a bottom surface 218 and side surfaces 214 and 216. The conductive seed layer 230 is disposed in the first groove 212 and the unitary conductive body 240 is disposed at least partially in the first groove 212. In some embodiments, at least one cross-section (e.g., the illustrated cross-section in the x-z plane) of the first groove 212 perpendicular to the longitudinal direction, the conductive seed layer 230 covers at least a majority (>50% by area) of the bottom surface 218 of the first groove 212, and the unitary conductive body 240 covers the conductive seed layer 230 and at least a majority (>50% by area) of the side surfaces 214 and 216 of the first groove 212. In some embodiments, each of the side surfaces 214 and 216 and the unitary conductive body 240 defines a conductor-insulator interface therebetween (245 and 247, respectively), and the unitary conductive body 240 and the conductive seed layer 230 defines a conductor-conductor interface 235 therebetween. In some embodiments, the unitary conductive body 240 is a unitary metallic body.

As described further elsewhere herein, in some embodiments, the unitary conductive body 240 has a lower first surface roughness at a first interface (245 and/or 247) with the side surfaces (214 and 216) and has a higher second surface roughness at a second interface (235) with the conductive seed layer 230.

As described further elsewhere herein, in some embodiments, in a plane through the unitary conductive body 240 that is parallel to and separate from the conductive seed layer 230, the unitary conductive body has a lower first line edge roughness at a first interface with the side surfaces 214, 216 and the conductive seed layer 230 has a higher second line edge roughness at an edge of the conductive seed layer 230.

In some embodiments, the unitary conductive body 240 may fill or over fill the groove 212. An embodiment in which the top surface of the unitary conductive body extends above a top surface of the substrate is schematically illustrated in FIG. 3.

Figure 3:
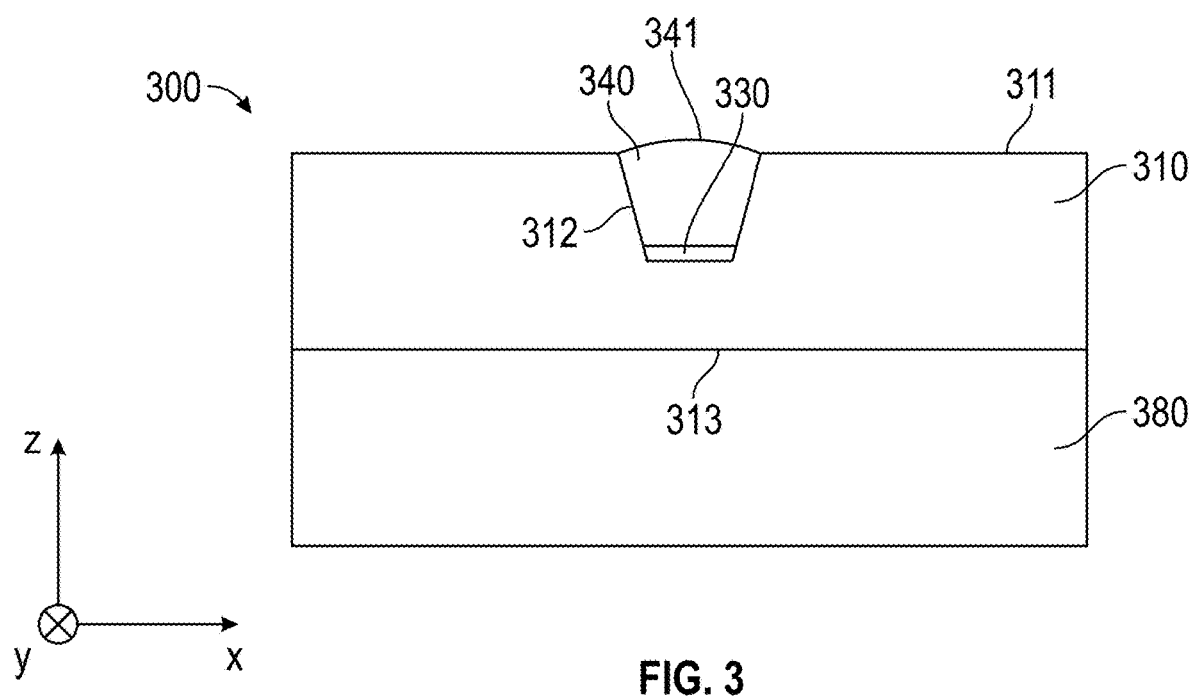

FIG. 3 is a schematic cross-sectional view of a portion of a patterned conductive article 300 including a substrate 310 including a first groove 312 therein and also including an optional optical film 380 bonded to the substrate 310. A conductive seed layer 330 is disposed in the first groove 312 and a unitary conductive body 340 is disposed at least partially in the first groove 312. The substrate 310 may include more than one layer (e.g., corresponding to substrate 210) and may include a unitary top layer, for example. The patterned conductive article 300 may correspond to the patterned conductive article 200 except that the unitary conductive body 340 extends beyond a top surface 311 of the substrate 310 in a center portion (in the illustrated cross-section) of the unitary conductive body 340 and the article 300 includes the optional optical film 380. The top surface 341 of the unitary conductive body 340, or of other unitary conductive bodies described herein, may be a convex dome (concave down) as illustrated, on may be concave up, or may be substantially planar, or may have an irregular shape, for example.

The optical film 380 may be laminated to the substrate 310 using an optically clear adhesive (not illustrated) or the substrate 310 may be formed directly on the optical film 380. The optical film 380 may be disposed on bottom surface 313 of the substrate 310 as illustrated or may be disposed on the top surface 311 of the substrate 310. In some embodiments, the optical film 380 is or includes one or more of a window film, a textured film, a patterned film, or an infrared reflective film. Useful optical films include those described in U.S. Pat. Appl. Publ. Nos. 2017/0248741 (Hao et al.), 2015/0285956 (Schmidt et al.), 2010/0316852 (Condo et al.), 2016/0170101 (Kivel et al.), 2014/0204294 (Lv), 2014/0308477 (Derks et al.), 2014/0057058 (Yapel et al.), 2005/0079333 (Wheatley et al.), and 2002/0012248 (Campbell et al.), for example.

In some embodiments, in the at least one cross-section of the first groove 312 (resp. 212), the unitary conductive body 340 (resp., 240) fills greater than half of a cross-sectional area of the first groove 312 (resp., 312). In some embodiments, the unitary conductive body 340 (resp., 240) fills at least 60%, or at least 70%, or at least 80%, or at least 90% of the cross-sectional area of the first groove 312 (resp., 212). In some embodiments, the unitary conductive body 340 (resp., 240) and the conductive seed layer 330 (resp., 230) together fill the cross-sectional area of the first groove 312 (resp., 212).

Figure 4:
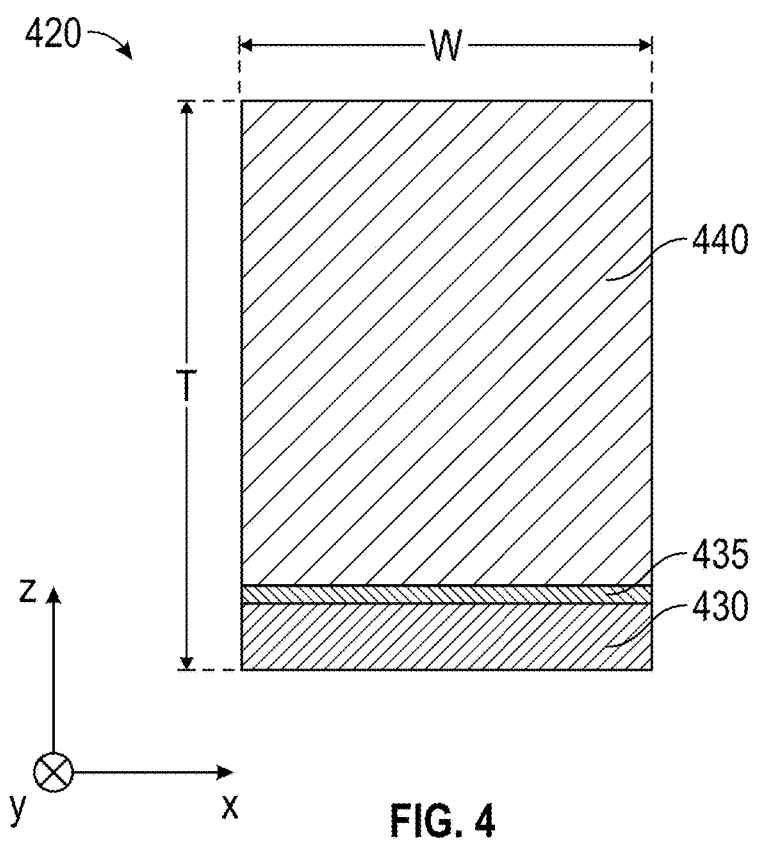
FIG. 4 is a schematic cross-sectional view of a trace.

FIG. 4 is a schematic cross-sectional view of a trace 420 including a unitary conductive body 440 disposed on a conductive seed layer 430. The trace 420 may have substantially vertical sidewalls as schematically illustrated in FIG. 4 or the sidewalls may be sloped as shown elsewhere herein. In some embodiments, the unitary conductive body 440 and the conductive seed layer 430 differ in at least one of composition or crystal morphology. The compositions can be different when the conductive seed layer 430 and the unitary conductive body 440 includes different metals, or when the conductive seed layer 430 is a cured conductive ink or a cured conductive coating, while the unitary conductive body 440 is a solid metal, for example. The different cross hatching in FIG. 4 may schematically represent different compositions, for example. Alternatively, or in addition, the different cross hatching in FIG. 4 may schematically represent different crystal morphologies, for example. The crystal morphologies can be different when the conductive seed layer 430 and the unitary conducive body 440 are formed from a same metal but the metals have differing grain size distributions due to differing process conditions in forming the materials, for example. As another example, the composition and crystal morphology can be different when the conductive seed layer 430 is formed from a first metal having a first crystal structure (e.g., one of face centered cubic (fcc), body centered cubic (bcc), or hexagonal close packed (hcp)) and the unitary conductive body 440 is formed from a different second metal having a different second crystal structure (e.g., a different one of fcc, bcc, or hcp). As still another example, the crystal morphology can be different when one of the unitary conductive body 440 and the conductive seed layer 430 is amorphous or substantially amorphous and the other of the unitary conductive body 440 and the conductive seed layer 430 has a substantial crystallinity. In some embodiments, the unitary conductive body 440 and the conductive seed layer 430 have different crystal morphologies that can be characterized in terms of different average grain sizes. The average grain size can be determined as described in ASTM standard E 112-13 "Standard Test Methods for Determining Average Grain Size", for example.

The unitary conductive body 440 and the conductive seed layer 430 define an interface 435 therebetween. The interface 435 can be sharp (e.g., when the unitary conductive body 440 and the conductive seed layer 430 have different compositions and there is little diffusion between the two layers) or broadened (e.g., when the unitary conductive body 440 and the conductive seed layer 430 have the same compositions but different crystal morphologies and there is a transition region between the different crystal morphologies, or when there is substantial diffusion between the two layers that broaden the interface 435). The interface 435 generally has a thickness substantially less than a thickness of the unitary conductive body 440. In some embodiments, the interface 435 has a thickness of less than 5 percent, or less than 2 percent, or less than 1 percent, or less than 0.5 percent of a thickness of the unitary conductive body 440. In some embodiments, the interface 435 is a conductor-conductor interface having a thickness of less than 1 micrometer, or less than 500 nm, or less than 300 nm, or less than 100 nm, or less than 50 nm.

In some embodiments, each conductive trace in at least a majority of the conductive traces in the micropattern has a width W along a width direction (x-direction) orthogonal to the longitudinal direction (y-direction) and to a thickness direction (z-direction) of the substrate, and has a thickness T along the thickness direction. In cases where the trace tapers, the width W can be understood to be the width of the trace at a vertical position where the trace is widest (e.g., proximate the top of the trace). In some embodiments, T/W is at least 0.8, 1, 1.2, 1.5, 2, 5, or 7. In some such embodiments, the patterned conductive article has an optical transmittance and/or open area fraction in any of the ranges described elsewhere herein.

Figure 5A:
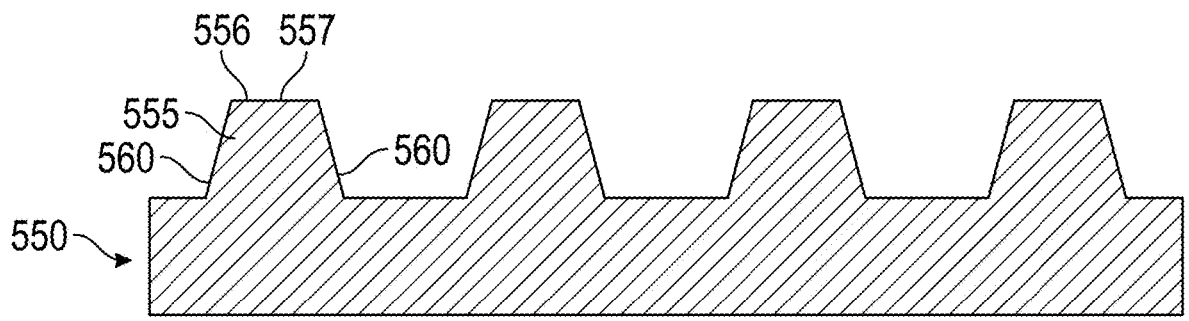
FIGS. 5A-5H are schematic illustrations of steps in processes for making a patterned conductive article.
Figure 5B:
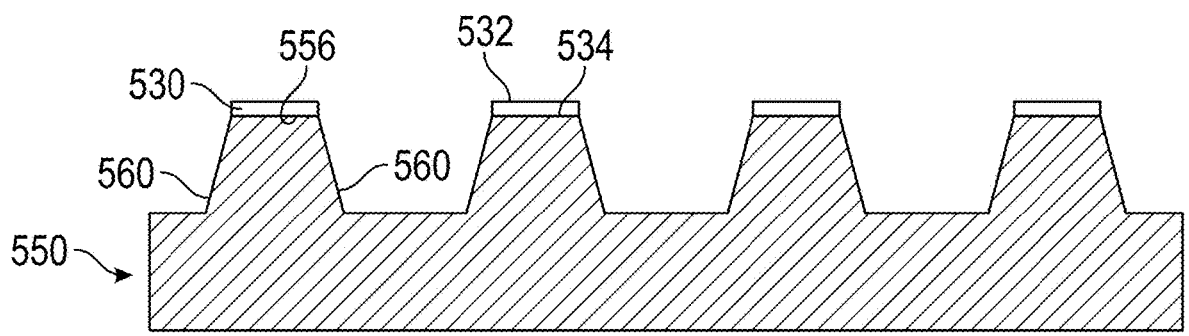

FIGS. 5A-5H schematically illustrate various steps in processes for making a patterned conductive article. In some embodiments, the process includes providing a tool 550 having at least one ridge 555 as schematically illustrated in FIG. 5A which is a schematic cross-sectional view of the tool 550. The tool 550 is schematically shown as having a substantially planar bottom surface in the illustrated embodiment. In other embodiments, the tool 550 has a generally cylindrical shape for example. The tool may be a metal tool (e.g., made by diamond turning as is known in the art) or may be a polymer tool formed from a metal tool (e.g., by compression molding the polymer against the metal tool), for example. The process includes disposing a conductive layer 530 on a top surface 556 of a first portion 557 of the at least one ridge 555 such that at least a majority of a total area of side surfaces 560 of the first portion 557 of the at least one ridge 555 is free of the conductive layer 530 as schematically illustrated in FIG. 5B. The conductive layer 530 has a major surface 534 in contact with the tool 550 and an opposite major surface 532. In some embodiments, at least a majority of a total area of side surfaces of the at least one ridge 555 is free of the conductive layer 530. After the conductive layer 530 is disposed on the top surface 556, the conductive material of the conductive layer 530 covers less than half, and preferably less than 25% or less than 10%, of the total area of side surfaces 560. In some embodiments, the first portion 557 may include all of the at least one ridge 555 and the top surface 556 may be the top surface(s) of all of the ridge(s) in the at least one ridge 555. In other embodiments, the portion (e.g., first portion 557b depicted in FIG. 5C) of the at least one ridge 555 which receives a conductive layer may include less than all of the at least one ridge 555.

Figure 5C:
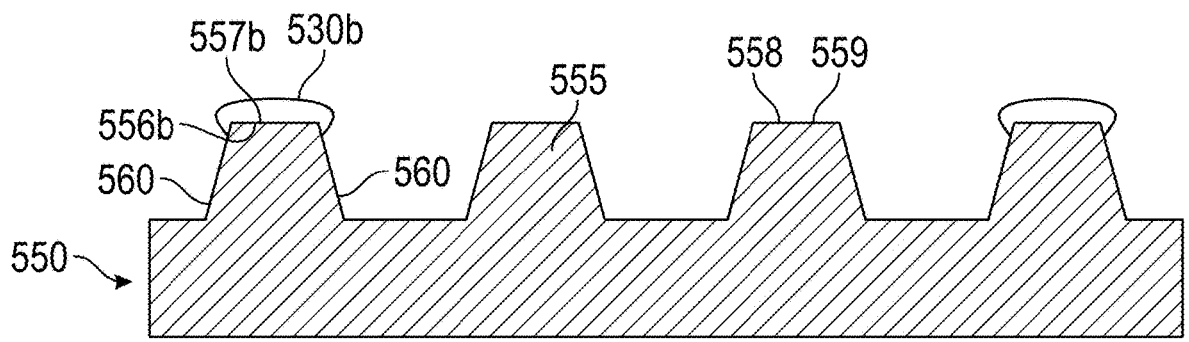

In some embodiments, after disposing the conductive layer 530 on a top surface 556b of a first portion 557b (see FIG. 5C) of the at least one ridge 555, a top surface 558 of a second portion 559 of the at least one ridge 555 is free of the conductive layer 530. This is schematically illustrated in FIG. 5C which schematically illustrates conductive layer 530b disposed on the top surface on only two of the illustrated four ridges. Providing a conductive layer on only a portion of the top surfaces of the ridges allows a tool having a uniform pattern (e.g., a uniform hexagonal pattern) to produce a conductor micropattern that has a non-uniform pattern (e.g., the conductor may be in a hexagonal pattern in some regions and may be absent from other regions). In some embodiments, the first portion 557b of the at least one ridge 555 includes a plurality of first ridges and the second portion 559 of the at least one ridge 555 includes a plurality of second ridges.

Figure 5D:
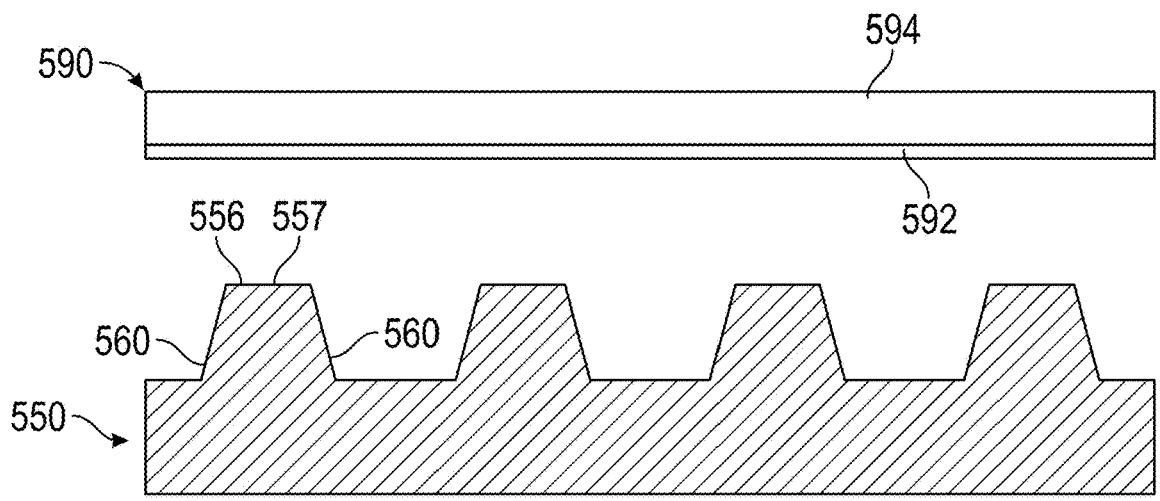
Figure 5E:
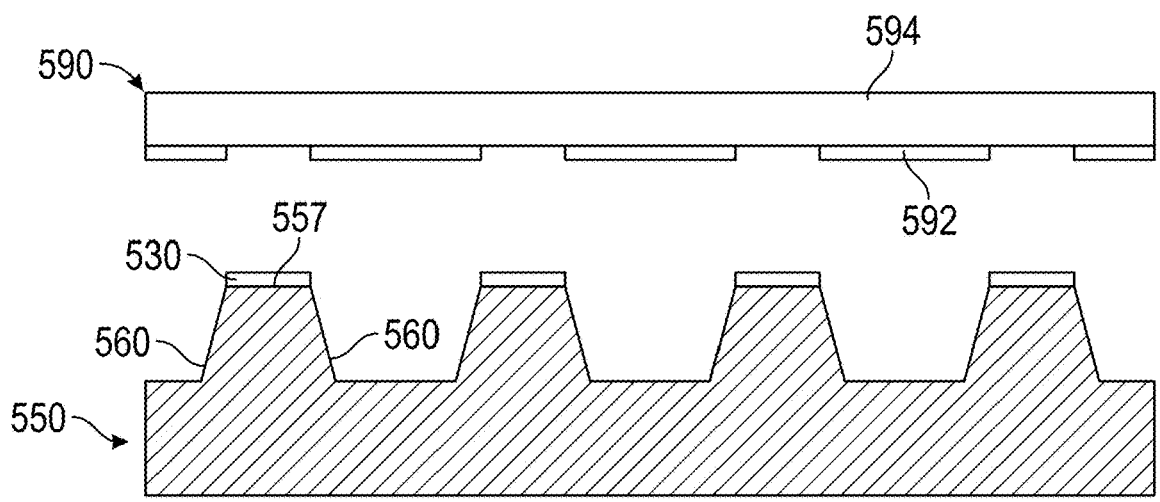

In some embodiments, the conductive layer 530 or 530b is provided as a transfer layer. In some embodiments, disposing the conductive layer 530 (or 530b) on the top surface 556 (or 556b) of the first portion 557 (or 557b) of the at least one ridge 555 includes transferring the conductive layer from a transfer film to the top surface. This is schematically illustrated in FIGS. 5D-5E which are schematic cross-sectional views before and after the conductive layer 530 is transferred to the top surface 556. The transfer film 590 includes a transfer layer 592 disposed on a substrate 594. When the transfer film 590 is contacted with the tool 550, portions of the transfer layer 592 are transferred from the substrate 594 to the top surface 556 to form the conductive layer 530. The transfer layer 592 may include sublayers. For example, the transfer layer 592 may include a metallic layer (or other conductive layer) and an adhesive layer for releasably attaching the metallic layer to the top surface 556. The metallic layer (or other conductive layer) may be a unitary conductive layer. The transfer layer 592 may further include a crosslinked polymer layer (e.g., acrylic) where the metallic or other conductive layer is disposed on either side of the crosslinked polymer layer. The transfer layer 592 may further include a dielectric layer which may be disposed between the metallic or other conductive layer and the crosslinked polymer layer. In some embodiments, the transfer layer 592 includes a dielectric layer that after being transferred to the tool 550 is between the transferred conductive layer the top surface 556. In such embodiments, a polymeric layer 510 (see FIG. 5G) formed using the tool with the transferred conductive layer may include the dielectric layer at the bottom of a groove 512 in the polymeric layer 510 and the process may include removing (e.g., via reactive ion etching) this dielectric layer. The transfer layer may be prepared as described in U.S. Pat. No. 8,658,248 (Anderson et al.) or U.S. Pat. No. 7,018,713 (Padiyath et al.), for example. The substrate 594 may include a release layer disposed on a polymer substrate layer. The transfer film may be as described in PCT Publ. Nos. WO 2018/178802 (Gotrik et al.) or WO 2018/178803 (Gotrik et al.), for example.

In some embodiments, the conductive layer 530 or 530b is applied as a conductive ink or as a conductive coating. In some embodiments, disposing the conductive layer 530b (or 530) on the top surface 556b (or 556) of the first portion 557b (or 557) of the at least one ridge 555 includes inking the tool 550 with conductive ink, or coating the tool with a conductive coating, such that the conductive ink or coating is disposed on the top surface. In some such embodiments, the conductive ink or coating is cured (e.g., by drying and sintering or by other means of curing such as those described elsewhere herein for curing the resin layer) and the cured conductive ink or coating is the conductive layer 530b (or 530). The curing the conductive ink or coating step may be carried out prior to the solidifying the resin step, after the solidifying the resin step, or simultaneously with the solidifying the resin step. Applying the conductive layer as a conductive ink or coating may result in some wetting of the side surface 560 as schematically illustrated in FIG. 5C.

Figure 5F:
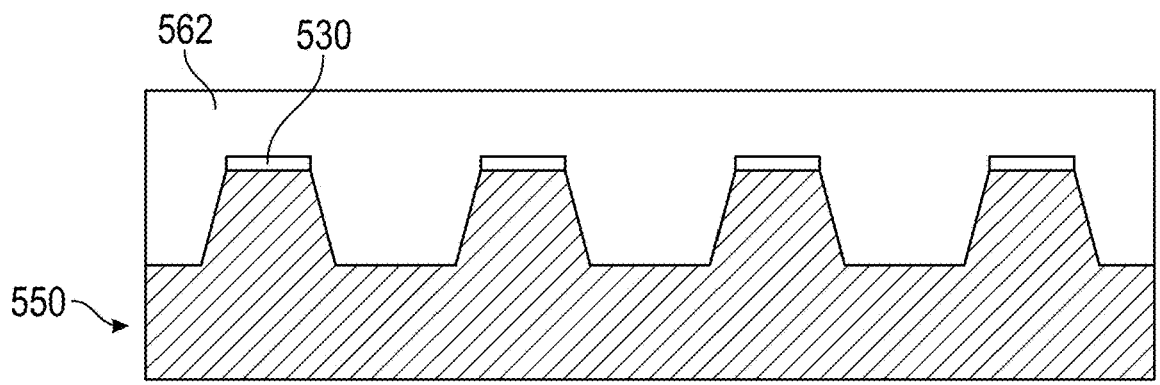
Figure 5G:
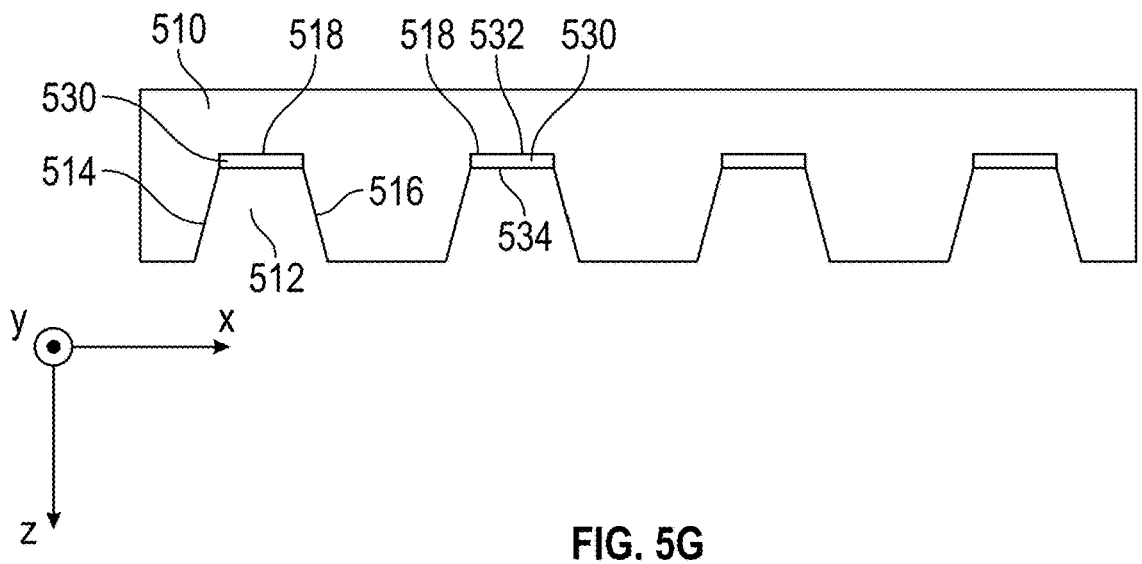
Figure 5H:
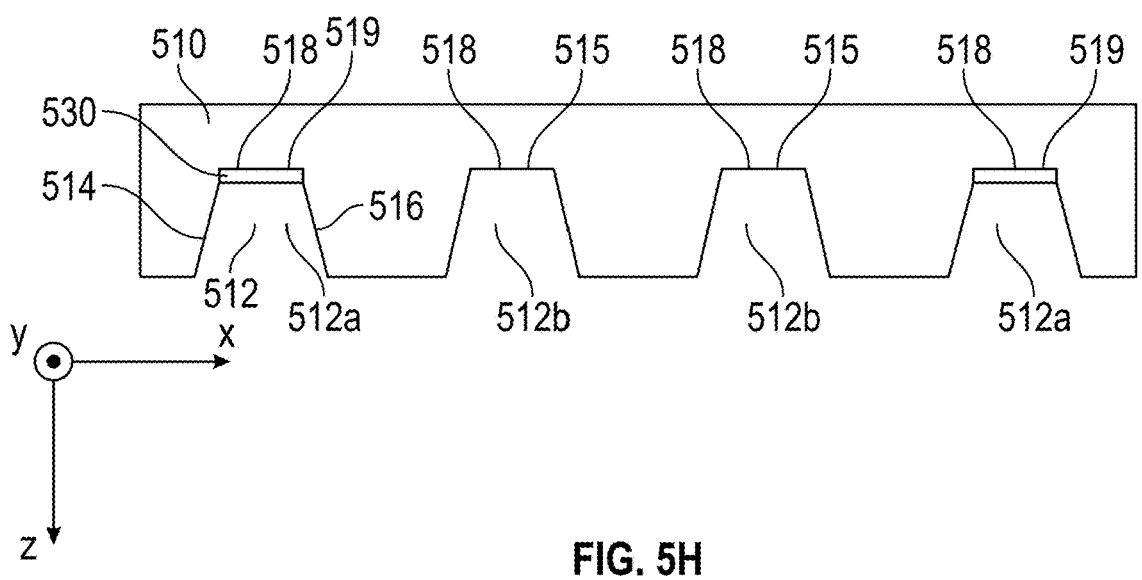

The process includes disposing (e.g., casting) a resin 562 onto the tool 550 after the disposing the conductive layer step; solidifying the resin to form a polymeric layer 510 including at least one groove 512 corresponding to the at least one ridge 555; removing the polymeric layer 510 and the conductive layer 530 from the tool 550 such that the conductive layer 530 is disposed at a bottom surface 518 of the at least one groove 512. FIG. 5F is a schematic cross-sectional view of the tool 550 including the resin 562 disposed on the tool 550. FIG. 5G is a schematic cross-sectional view of the polymeric layer 510 with the conductive layer 530 disposed at the bottom surface 518 of the at least one groove 512. A major surface 532 of the conductive layer 530 contacts the bottom surface 518 of the at least one groove 518. The conductive layer 530 may cover all or substantially all of a total surface area of the bottom surface 518 of the least one groove 512 or may cover a first portion 519 (e.g., corresponding to first portion 557b) of the bottom surface 518 while a second portion 515 of the bottom surface 518 is free of the conductive layer 530 as schematically illustrated in FIG. 5H.

Spatially related terms, including but not limited to, "bottom", "lower", "upper", "beneath", "below", "above," "top", and "on top," if used herein, are utilized for ease of description to describe spatial relationships. Such spatially related terms encompass different orientations of the article in use or operation in addition to the particular orientations depicted in the figures and described herein. For example, a bottom surface of a groove is opposite an open top of the groove regardless of whether a substrate including the groove is turned over or flipped over.

The at least one groove 512 may be described as corresponding to the at least one ridge 555 when each groove in the at least one groove is formed from a ridge in the at least one ridge 555. The correspondence may be or not be one to one. For example, in some embodiments, the tool is generally cylindrical and is used in a continuous roll-to-roll processes, and the same ridge may form a plurality of grooves in the at least one groove 512 (e.g., if the tool has a circumference of 20 cm, the same ridge in the tool may be used to make a plurality of grooves in the polymer layer that are spaced apart from one another by 20 cm). In some cases, the tool may include additional ridges not coated by the resin and there may be no groove that corresponds to the uncoated ridge (e.g., if no resin is cast onto an end portion of the tool, any ridge that may be present in the end portion would not produce a groove in the resulting polymer layer).

In some embodiments, solidifying the resin includes curing the resin. For example, the resin may be cured by applying radiation (e.g., ultraviolet (UV) radiation, or electron-beam radiation, or other actinic radiation), or by applying heat, or by using other cross-linking mechanisms known in the art. The resin may be an acrylate or an epoxy, for example, or other resin chemistries may be used. In some embodiments, solidifying the resin includes cooling the resin. For example, the resin may be a thermoplastic resin (e.g., polyethylene terephthalate, polypropylene, polycarbonate, or other thermoplastic resins known in the art) applied as a melt that is cooled to form a thermoplastic polymer layer.

In some embodiments, the process further includes depositing conductive material (e.g., via electroplating) into the at least one groove 512 such that the conductive material covers the conductive layer 530. This may be done after removing the polymeric layer 510 and the conductive layer 530 from the tool 550 as illustrated in FIGS. 5G-5H. The conductive material may form a unitary conductive body as described elsewhere herein. In some embodiments, depositing conductive material into the at least one groove 512 includes depositing conductive material into a first portion 512a of the at least one groove (e.g., the portion of the at least one groove 512 including the conductive layer 530) corresponding to the first portion of the least one ridge and not into a second portion 512b of the at least one groove (e.g., the portion of the at least one groove 512 not including the conductive layer 530) corresponding to the second portion of the at least one ridge.

In some embodiments, the articles schematically depicted FIGS. 5G-5H may be described as including a substrate (e.g., polymeric layer 510, or a polymeric layer 510 plus a substrate layer on which polymeric layer 510 may be formed) including a first groove therein (e.g., any of grooves 512 depicted in FIG. 5G or any of grooves in the first portion 512a depicted in FIG. 5H) where the first groove extends along a longitudinal direction (y-direction) and has a bottom surface 518 and side surfaces 514 and 516; and a unitary conductive layer (e.g., conductive layer 530 or a unitary sublayer (e.g., a transferred metallic layer) of conductive layer 530) disposed in the first groove. In at least one cross-section of the first groove perpendicular to the longitudinal direction, the conductive layer covers at least a majority of the bottom surface of the first groove, and at least a majority of the side surfaces of the first groove does not contact material having a same composition as that of the unitary conductive layer. For example, in some embodiments, the side surfaces 514 and 516 may contact air. In some embodiments, a dielectric material, or a conductive material having a different composition from that of the unitary conductive layer, or a nonmetallic material is disposed at least partially in the first groove and in the at least one cross-section of the first groove where this material covers at least a majority of the side surfaces of the first groove (see, e.g., FIG. 14).

Figure 6:
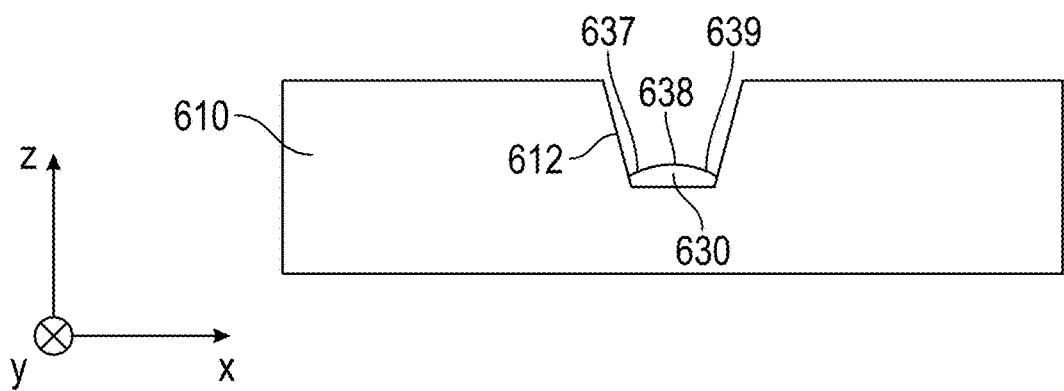
FIG. 6-7 are schematic cross-sectional views of substrates that include a groove with a conductive seed layer disposed on a bottom surface of the groove.

FIG. 6 is a schematic cross-sectional view of a layer 610 (which may be a unitary layer of a multilayer substrate and/or which may be a polymeric layer, for example) including a groove 612 with a conductive seed layer 630 disposed on a bottom surface of the groove 612. The bottom major surface of the conductive seed layer 630 may be in direct contact with the layer 610. A unitary conductive body may be formed (e.g., by plating) on the conductive seed layer 630 to form a trace extending along a length (y-direction) of the trace. In some embodiments, the conductive seed layer 630 has a central region 638 extending along a length of the conductive trace and being disposed between first and second edge regions 637 and 639 extending along a length of the central region 638. In some embodiments, the central region 638 has an average thickness (unweighted mean of the thickness) greater than an average thickness of each of the first and second edge regions 637 and 639.

Figure 7:
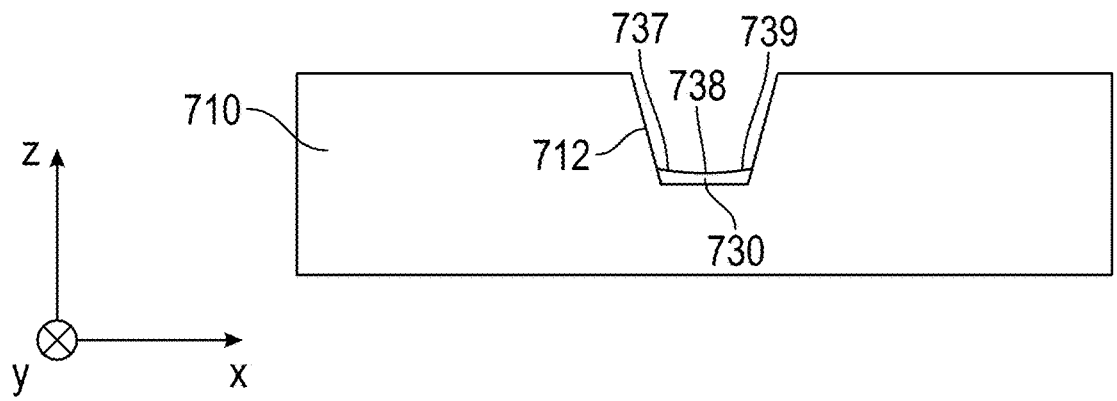

FIG. 7 is a schematic cross-sectional view of a layer 710 (e.g., a unitary layer of a substrate) including a groove 712 with a conductive seed layer 730 disposed on a bottom surface of the groove 712. The layer 710 may correspond to layer 610 and the conductive seed layer 730 may correspond to the conductive seed layer 630 except for the thicknesses of the central region 738 and the edge regions 737 and 739. A unitary conductive body may be formed (e.g., by plating) on the conductive seed layer 730 to form a trace extending along a length (y-direction) of the trace. In some embodiments, the conductive seed layer 730 has a central region 738 extending along the length of the conductive trace and being disposed between first and second edge regions 737 and 739 extending along a length of the central region 738. In some embodiments, the central region 738 has an average thickness less than an average thickness of each of the first and second edge regions 737 and 739.

In some embodiments, top surfaces of ridges of a tool used in forming conductive seed layers are substantially flat and the relative thickness of the central and edge regions depend on one or more of the surface energy of the material deposited to form the conductive seed layer, the surface energy of the material of the tool, and the surface energy of the material of the substrate. In other embodiments, top surfaces of the ridges may be shaped to determine the relative thickness of the central and edge regions. In some embodiments, the thicknesses of the central and edge regions are about the same (e.g., differ by less than 10%, or less than 5%).

Figure 8:
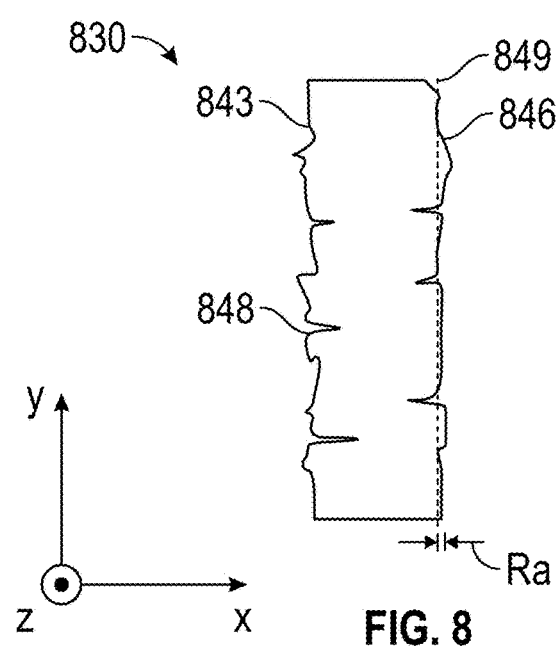
FIG. 8 is a schematic top view of a conductive seed layer.

In some embodiments, a conductive seed layer includes irregular edges or fractured edges. In some embodiments a conductive seed layer includes a plurality of fractures. For example, in some embodiments, the conductive seed layer is a transferred layer and the transfer process results in fractures. The fractures may extend from an edge to an interior region of the conductive seed layer, for example. FIG. 8 is a schematic top view of a conductive seed layer 830 which includes side edges 843 and 846. In some embodiments, the roughness of the edges 843 and 846 may characterized in terms of a line edge roughness. The roughness parameter Ra may be used for the line edge roughness. For example, the edge 846 has a line edge roughness Ra which can be described as the mean of an absolute value of displacement of the edge 846 from the mean location 849 of the edge. The line edge roughness Ra may be in any of the ranges described elsewhere herein. In the illustrated embodiment, the conductive seed layer 830 includes a plurality of fractures 848 and the edges 843 and 846 are fractured edges.

Figure 9:
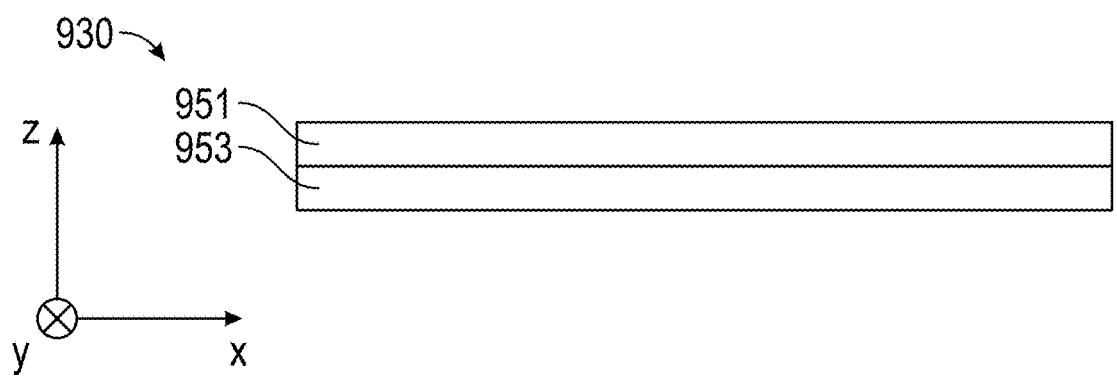
FIGS. 9-10 are schematic cross-sectional views of conductive seed layers.
Figure 10:
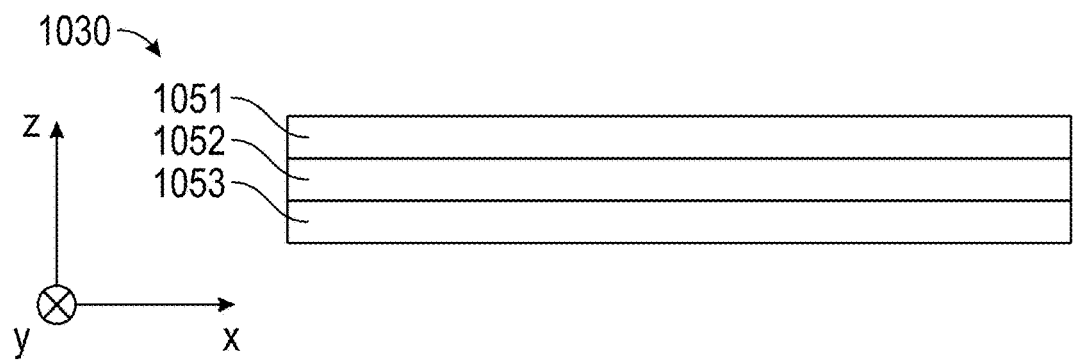

A conductive seed layer may be a single unitary layer or may include a plurality of sublayers. For example, the conductive seed layer may include an electrically conductive sublayer disposed on a non-conductive sublayer which may be at least one of a tie layer or a crosslinked polymer layer. FIG. 9 is a schematic cross-sectional view of a conductive seed layer 930 that includes a conductive layer 951 disposed on a crosslinked polymer layer 953. The conductive layer 951 may be a sputtered or vapor deposited metal layer, for example. The crosslinked polymer layer 953 may be a crosslinked acrylic layer, for example. In some embodiments, the conductive seed layer 930 further includes a dielectric layer (e.g., an oxide layer) disposed between the conductive layer 951 and the crosslinked polymer layer 953. FIG. 10 is a schematic cross-sectional view of a conductive seed layer 1030 that includes a conductive layer 1051 disposed (indirectly) on a crosslinked polymer layer 1053 with a dielectric layer 1052 disposed between the conductive layer 1051 and the crosslinked polymer layer 1053. In some embodiments, the dielectric layer 1052 is or includes an oxide layer (e.g., a silicon aluminum oxide layer). In some embodiments, the thickness of crosslinked polymer layer 953 or 1053 is less than 500 nm, or 300 nm, or 100 nm. In some embodiments, the conductive seed layer 951 or 1051 is or includes a metallic layer having a thickness of less than 500 nm, or 300 nm, or 100 nm. The conductive layer 951 and/or the conductive layer 1051 may be a unitary conductive layer.

Figure 11A:
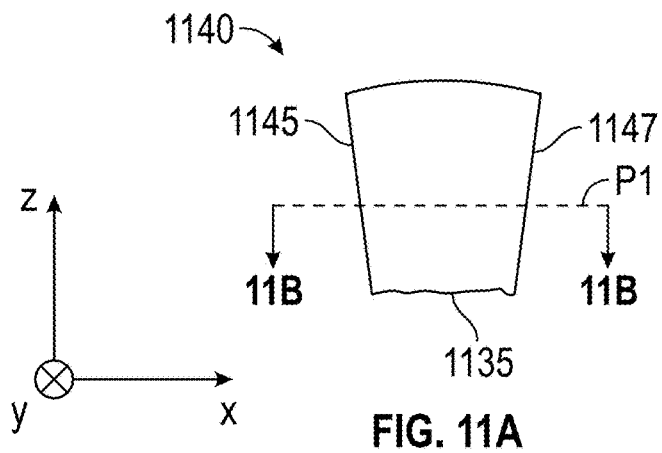
FIGS. 11A-11B are schematic cross-sectional views of a unitary conductive body in orthogonal cross-sections.

FIG. 11A is a schematic cross-sectional view of a unitary conductive body 1140. The unitary conductive body 1140 may be disposed at least partially in a groove in a substrate (not illustrated in FIG. 11A) where the groove has a bottom surface and side surfaces. The unitary conductive body 1140 has an interface 1145 with a side surface, an interface 1147 with a side surface, and an interface 1135 with a conductive seed layer disposed on the bottom surface of the groove. In some embodiments, the unitary conductive body 1140 may have a lower first surface roughness at a first interface (1145 and/or 1147) with the side surfaces and a higher second surface roughness at a second interface (1135) with the conductive seed layer. For example, in some embodiments, the substrate includes a unitary polymeric layer and the unitary conductive body 1140 forms a relatively smooth interface with the unitary polymeric layer, while the seed layer may include a fractured layer which results in a relatively rough interface with the unitary conductive body 1140. The first and second surface roughness may be the arithmetic average roughness Ra (mean of absolute value of displacement of the surface from the mean surface height) of the respective first and second interfaces. In some embodiments, the first surface roughness is less than 1 micrometer, or less than 500 nm, or less than 200 nm, or less than 100 nm, less than 50 nm, or less than 30 nm. In some embodiments, the second surface roughness is greater than 0.4 micrometers, or greater than 500 nm, or greater than 1 micrometer, or greater than 2 micrometers, or greater than 5 micrometers. In some embodiments, the second surface roughness is greater than the first surface roughness by at least 0.5 micrometers, or at least 1 micrometer, or at least 2 micrometers.

Figure 11B:
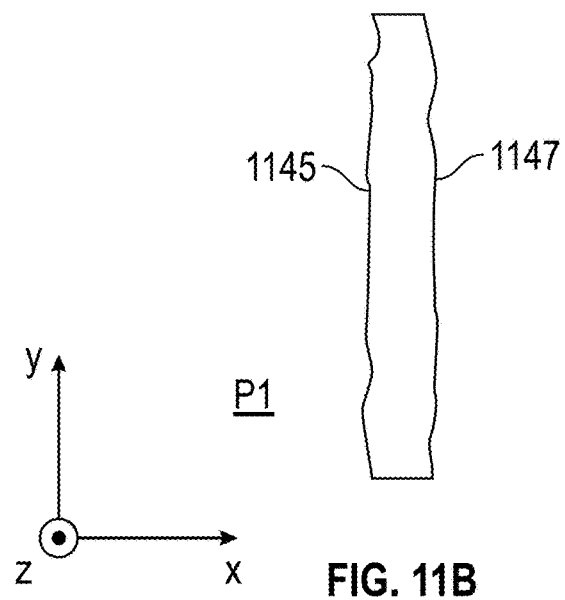

FIG. 11B is a schematic view of the unitary conductive body 1140 in a cross-section in the plane P1. In some embodiments, in a plane P1 through the unitary conductive body 1140 that is parallel to and spaced apart from the seed layer (disposed at the interface 1135; not illustrated in FIGS. 11A-11B), the unitary conductive body 1140 may have a lower first line edge roughness at a first interface 1145 or 1147 with the side surfaces and the seed layer may have a higher second line edge roughness at an edge (e.g., edge 846 depicted in FIG. 8) of the conductive seed layer. The plane P1 may be taken to be about halfway between a top and a bottom of the conductive body 1140, for example. The first and second line edge roughnesses may each be Ra roughnesses (mean of an absolute value of displacement of the edge from the mean line of the edge). In some embodiments, the first line edge roughness is less than 1 micrometer, or less than 500 nm, or less than 200 nm, or less than 100 nm, less than 50 nm, or less than 30 nm. In some embodiments, the second line edge roughness is greater than 0.4 micrometers, or greater than 500 nm, or greater than 1 micrometer, or greater than 2 micrometers, or greater than 5 micrometers. In some embodiments, the second line edge roughness is greater than the first line edge roughness by at least 0.5 micrometers, or at least 1 micrometer, or at least 2 micrometers.

Figure 12A:
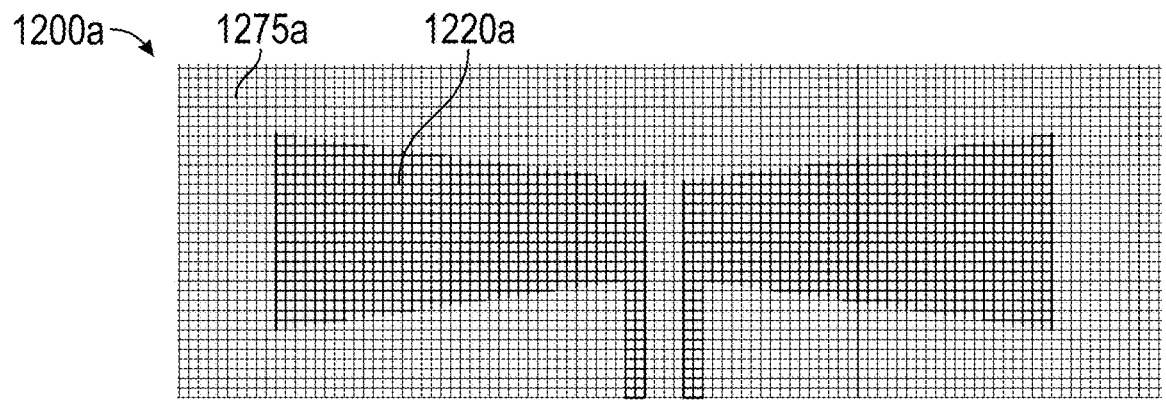
FIGS. 12A-12B are schematic top plan views of patterned conductive articles which may be antennas.
Figure 12B:
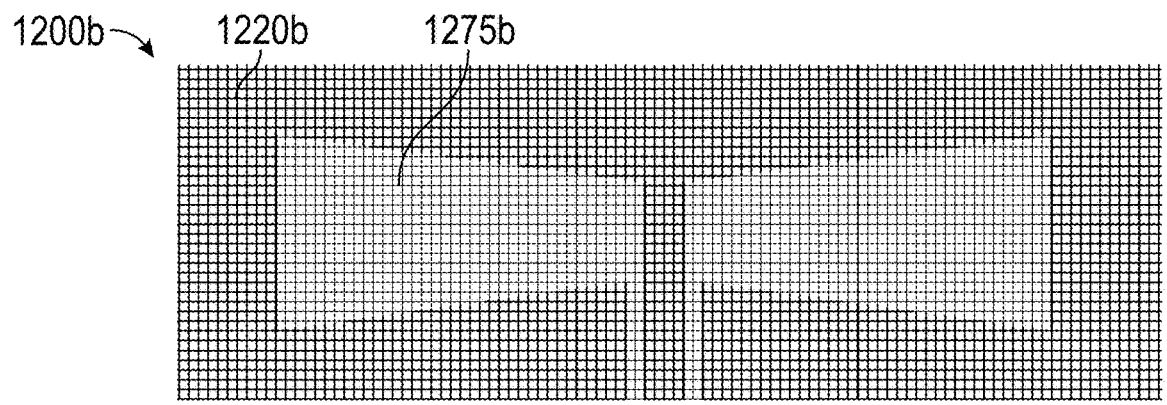

In some embodiments, a patterned conductive article includes a micropattern of conductive traces disposed at least partially in a micropattern of grooves where the micropattern of grooves includes at least one groove filled or substantially filled (e.g., at least 60%, or at least 70%, or at least 80%, or at least 90% filled, or 100% filled, or over filled) with a non-conductive material. For example, the non-conductive material may be air or a dielectric material which can be understood be an electrically non-conductive material having a dielectric constant greater than that of air. FIG. 12A is a schematic top plan view of a patterned conductive article 1200a which includes a micropattern of conductive traces 1220a disposed at least partially in a micropattern of grooves where the micropattern of grooves includes at least one groove 1275a (a plurality of grooves in the illustrated embodiment) filled or substantially filled with a non-conductive material. Similarly, FIG. 12B is a schematic top plan view of a patterned conductive article 1200b which includes a micropattern of conductive traces 1220b disposed at least partially in a micropattern of grooves where the micropattern of grooves includes at least one groove 1275b (a plurality of grooves in the illustrated embodiment) filled or substantially filled with a non-conductive material.

In some embodiments, the patterned conductive article 1200a or 1200b is an antenna. In some embodiments, the micropattern of conductive traces 1220a or 1220b is configured to provide a predetermined spectral response. For example, the micropattern may have an overall size and shape so that it can efficiently transmit and receive in a predetermined wavelength or frequency range. In some such embodiments, the micropattern of conductive traces 1220a or 1220b is configured to provide a predetermined directivity. For example, the micropattern may have an overall size and shape (e.g., a bow-tie antenna as schematically illustrated in FIG. 12A or a bow-tie slot antenna as schematically illustrated in FIG. 12B) so that it can efficiently transmit and receive in a predetermined wavelength range with a predetermined directivity (e.g., transmit more strongly along a specified direction than another direction). The patterned conductive article 1200a or 1200b may be a 5G antenna, for example, and/or may be configured to transmit and receive in a frequency band from 30 to 300 GHz, for example. Useful antenna geometries are described in U.S. Pat. Appl. Publ. Nos. 2009/0051620 (Ishibashi et al.), 2009/0303125 (Caille et al.), and 2013/0264390 (Frey et al.), for example. In some embodiments, the patterned conductive article 1200a or 1200b is a substantially transparent antenna. For example, in some embodiments, the patterned conductive article 1200a or 1200b is adapted to be placed on a window where it is desired to use the article as an antenna and be able to see through the antenna.

Figure 13:
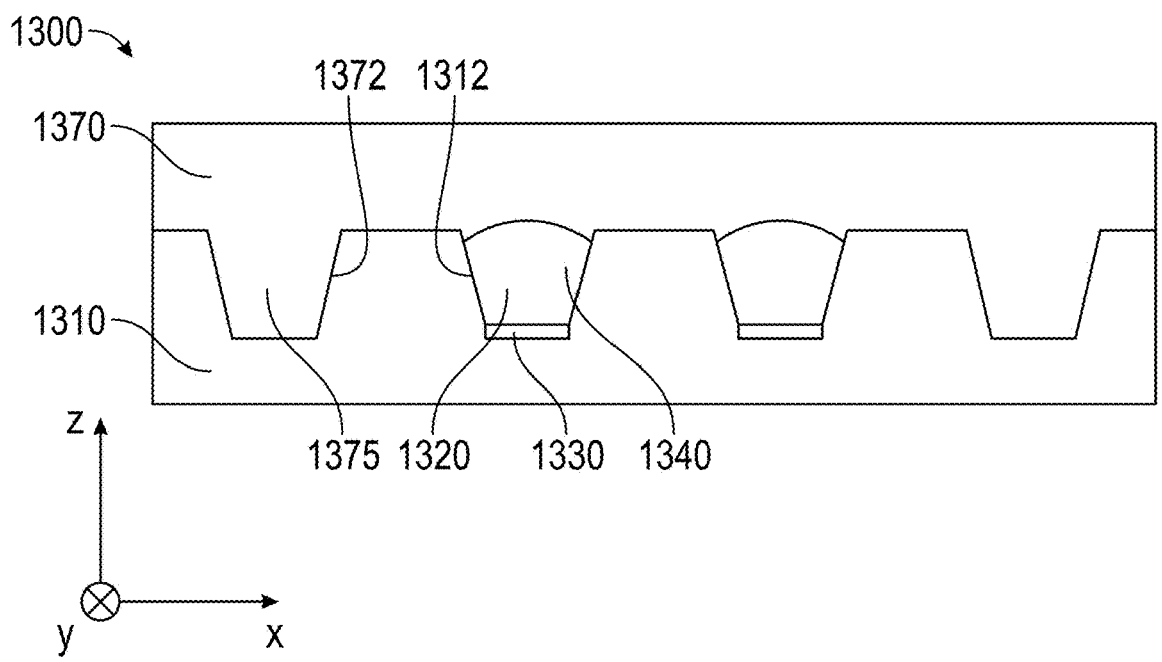
FIGS. 13-14 are schematic cross-sectional views of patterned conductive articles.

FIG. 13 is a schematic cross-sectional view of a patterned conductive article 1300 or a portion of the article 1300 that may correspond to patterned conductive article 1200a or 1200b, for example. The patterned conductive article 1300 includes a layer 1310 (e.g., a unitary top layer of a substrate) including a micropattern of grooves which includes a first groove 1312 and a second groove 1372. First groove 1312 includes trace 1320 which includes a unitary conductive body 1340 disposed on a conductive seed layer 1330. Second groove 1372 may be substantially filled with a material 1375 which may be substantially transparent and/or non-conductive. For example, a micropattern of grooves may be provided with conductive traces in some of the grooves as described further elsewhere herein and then a coating 1370 may be applied to over the grooves such that the material 1375 of the coating 1370 fills or substantially fills grooves not containing traces. In some embodiments, in a least one cross-section orthogonal to a length of the second groove 1372, the second groove 1372 is substantially filled with a substantially transparent material.

The material 1375 may be a non-conductive material and/or a substantially transparent material and may be one or more of an adhesive, a polymer, or a dielectric material (e.g., a polymeric optically clear adhesive). In some embodiments, the material 1375 has a refractive index within 0.02 of a refractive index of the layer 1310. The refractive index is determined at a wavelength of 532 nm, unless specified differently.

Figure 14:
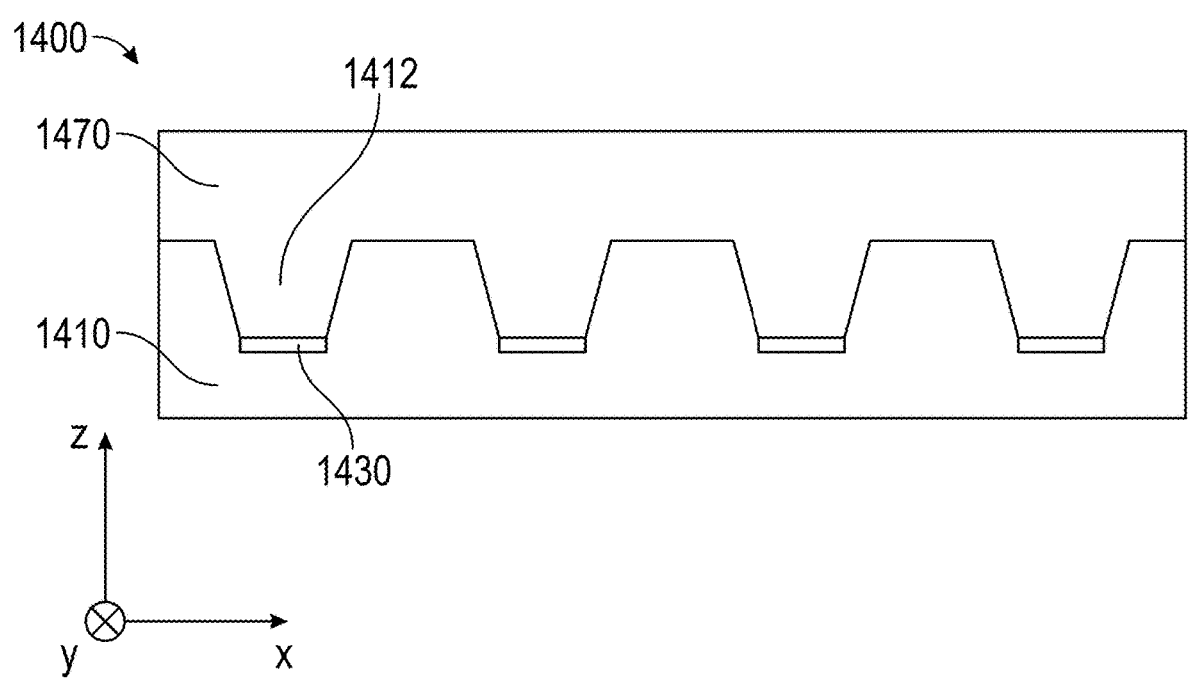

FIG. 14 is a schematic cross-sectional view of a patterned conductive article 1400 or a portion of the article 1400. The patterned conductive article 1400 includes a layer 1410 (e.g., a unitary layer of a substrate) including a first groove 1412 (e.g., a groove in a micropattern of grooves) which extends along a longitudinal direction (y-direction) and has bottom surface and side surfaces. First groove 1412 includes a unitary conductive layer 1430 disposed in the first groove. In at least one cross-section of the first groove perpendicular to the longitudinal direction, the conductive layer covers at least a majority of the bottom surface of the first groove, and at least a majority of the side surfaces of the first groove does not contact material having a same composition as that of the conductive layer. In some embodiments, the unitary conductive layer 1430 may be used as the traces (e.g., without plating a unitary conductive body onto the conductive layer 1430). This may be desired in applications where the conductive layer 1430 provides sufficient conductivity and where the durability of the conductive layer 1430 is improved by disposing the layer at the bottom surface of the groove.

In some embodiments, a nonmetallic material 1470 is disposed at least partially in the first groove 1412. In some embodiments, in the at least one cross-section of the first groove, the nonmetallic material 1470 covers at least a majority of the side surfaces of the first groove 1412. In the illustrated embodiment, the nonmetallic material 1470 forms a continuous layer which fills the first groove 1412 (and fills other grooves). For example, the nonmetallic material 1470 may be may be one or more of an adhesive, a polymer, or a dielectric material (e.g., a polymeric optically clear adhesive) that forms a continuous layer filling in each groove. In some embodiments, the material 1470 has a refractive index within 0.02 of a refractive index of the layer 1410. In some embodiments, the material 1470 is substantially transparent. In some embodiments, the material 1470 is disposed substantially only in the grooves in the layer 1410 (e.g., a portion of a coated material above the grooves may be wiped off). In some embodiments, the material 1470 is electrically conductive (e.g., a transparent electrically conductive polymer such as poly(3,4-ethylenedioxythiophene) (PEDOT), PEDOT polystyrene sulfonate (PEDOT:PSS), or poly(4,4-dioctylcyclopentadithiophene)).

EXAMPLES

Preparation of UV Curable Resin 75 parts PHOTOMER 6210 (available from Cognis (Monheim am Rhein, Germany)), 25 parts hexanediol diacrylate, SARTOMER SR238 (available from Sartomer USA (Exton, PA)), and 0.5% of LUCIRIN TPO (available from BASF (Ludwigshafen, Germany)) were blended with a high-speed mixer, and then heated in an oven at 160° F. (71° C.) for 24 hours. The compounded resin was subsequently cooled to room temperature.

Example 1

Molding of VISTAMAXX Tool Including Linear Channel Array 1 layer of VISTAMAXX 3588, 0.47 mm thick sheet (available from ExxonMobile Chemical, Houston TX) was placed on metal tooling containing linear ribs that were 40 μm wide on a 125 μm pitch, and that were 81 μm tall. The films were 250 mm×280 mm in size. The samples were pressed in a compression molder Rucker PHI 400 ton (City of Industry, CA) to form molded tools. The molding conditions used were as follows:

Temperature: 225° F.
Low pressure: 6,000 lbs; Time: 1 min
Raised low pressure: 80,000 lbs; Time: 20 min
Cooled to nominally 100° F.

Silver Transfer Layer Preparation

A transferrable thin seed layer film was made on a vacuum coater similar to the coater described in U.S. Pat. No. 8,658,248 (Anderson et al.) and U.S. Pat. No. 7,018,713 (Padiyath, et al.). This coater was threaded up with a substrate in the form of an indefinite length roll of 980 microinch (0.0250 mm) thick, 14 inch (35.6 cm) wide aluminized biaxially-oriented polypropylene film under the trade name TorayFAN PMX2 commercially available from Toray Plastics (America), Inc. (North Kingstown, RI). This substrate was then advanced at a constant line speed of 32 fpm (9.8 m/min).

A first organic layer was formed on the substrate by applying an acrylate liquid based on tricyclodecane dimethanol diacrylate, under the trade name of SARTOMER SR833S from Sartomer USA (Exton, PA), by ultrasonic atomization and flash evaporation to make a coating width of 12.5 inches (31.8 cm). This monomeric coating was subsequently cured immediately downstream with an electron beam curing gun operating at 7.0 kV and 10.0 mA. The flow of liquid monomer into the evaporator was 0.67 ml/min, the nitrogen gas flow rate was 100 sccm and the evaporator temperature was set at 500° F. (260° C.). The process drum temperature was 14° F. (−10° C.).

On top of this first organic layer, a silver reflector layer was deposited by DC sputtering of a >99% silver cathode target. The system was operated at 3 kW with a 30 fpm (9.1 meters per minute) line speed. Two subsequent depositions with the same power and line-speed were done to create a 90 nm layer of silver.

On top of this silver layer, an oxide layer of silicon aluminum oxide was deposited by AC reactive sputtering. The cathode had a Si(90%)/Al(10%) target obtained from Soleras Advanced Coatings US, of Biddeford, (ME). The voltage for the cathode during sputtering was controlled by a feed-back control loop that monitored the voltage and controlled the oxygen flow such that the voltage would remain high and not crash the target voltage. The system was operated at 16 kW of power to deposit a 12 nm thick layer of silicon aluminum oxide onto the silver reflector.

Similar to what is described in PCT Publ. Nos. WO 2018/178802 (Gotrik et al.) or WO 2018/178803 (Gotrik et al.), the aluminum surface of the TorayFAN PMX2 film and the first organic layer was expected to decouple with a 180 Peel force of about 7.2 g/in (0.28 g per mm).

Procedure for Double Layer Transfer

The equipment used in this process included compression molded VISTAMAXX tool samples, a roll of the silver transfer film described above, one roll of 2 mil polyethylene terephthalate (PET) film with one side primed, UV Curable Resin, one rubber hand-roller with 0.6 in. (1.52 cm) of diameter and 9 in. (22.9 cm) of length, MASTER HEAT GUN model HG-501A, and OMEGA Type J thermocouple, RPC Industries (Hampton, VA) UV Processor (Model QC120233AN), plastic transfer pipette, and 11 in. by 15 in. (27.9 cm by 38.1 cm) metal plate.

A VISTAMAXX tool was provided in 8.5 in by 9.5 in (21.5 cm by 24.1 cm) sheet which was set on a flat surface with the micro-structure facing up. A silver transfer layer film was cut into 10 in by 11 in (25.4 cm by 27.9 cm by) pieces. Hot air from heat gun was distributed evenly to the surface of the sample to heat up to 150° C. Since the sample deforms under high temperature, the surface temperature was monitored using the thermocouple. When the desired temperature was reached, hot air was disconnected, and the silver transfer layer film was placed on the heated VISTAMAXX film, with the silver transfer layer facing down. The sample was hand laminated once by applying a gentle force using the rubber hand roller. The silver transfer layer was immediately pulled away from the VISTAMAXX sample and was found to be lightly attached to the tops of the ribs but not where the open channels between the ribs was located. The quality of the silver transfer layer transfer was evaluated under optical microscope and found to have electrical continuity.

After the silver transfer layer was transferred to the VISTAMAXX tool, it was transferred to a resin layer as follows. The UV processor was turned on following the instruction manual with lamp at normal setting and the conveyor belt speed of 50 RPM. The VISTAMAXX sample with silver transfer layer was taped down on a metal plate. With a transfer pipette, a line of UV Curable Resin was dispensed on one side of the sample. Primed 2 mil PET film was cut into 10 in by 11 in (25.4 cm by 27.9 cm by) piece which was stacked on top of the VISTAMAXX sample with the primed side facing down. The sample was laminated with the rubber hand roller slowly to remove entrapped air bubbles between the VISTAMAXX and PET films. Afterward, the sample was delivered through the UV processor twice under inert gas to drive the curing process to completion. The PET film was detached slowly from the VISTAMAXX tool. The quality of silver transfer layer transfer to polymer film was assessed under optical microscope. The silver transfer layer transferred completely to the bottom of the UV cured film. The samples were stored at ambient condition for more than 24 hours before further analysis.

Procedure for RIE Removal of the Dielectric Layer From the Transferred Layer

A commercial batch plasma system (Plasma-Therm (Petersburg, FL) Model 3032) with a 26-inch lower powered electrode and central gas pumping was used to remove the dielectric layer (silicon aluminum oxide layer) via reactive ion etching (RIE). The chamber was pumped by a roots blower (Edwards (Burgess Hill, UK) Model EH1200) backed by a dry mechanical pump (Edwards Model iQDP80). RF power was delivered by a 5 kW, 13.56 Mhz solid-state generator (RF Plasma Products Model RF50S0) through an impedance matching network. The system had a nominal base pressure of 5 mTorr. The flow rates of the gases were controlled by MKS flow controllers (available from MKS Instruments, Andover, MA).

Samples of the substrates were fixed on the powered electrode of the batch plasma apparatus. The plasma etching was completed by feeding 500 SCCM of oxygen into the chamber after evacuating the chamber to <10 mTorr. Once the flows were stabilized, the rf power was applied to the electrode to generate the plasma at 1000 W. The plasma was left on for 15 seconds.

After the plasma treatment was completed, the chamber was vented to atmosphere and the substrates were taken out of the chamber.

Copper Plating Within the Grooves

The RIE etched film was rinsed with DI water and put into a solution composed of copper sulfate (29 oz/gal) and sulfuric acid (8 oz/gal). The solution flow rate was 11 gal/minute. The plating was conducted with a power supply made by DYNATRONIX (Amery WI), Model DPR20-250-500, in a potentiostatic mode. The solution temperature was 21° C. The plating was controlled at 1.6V for 25 min. After the plating, the part was rinsed, dried, and examined under microscopy. Copper was confirmed to plate on the silver transfer layer where the dielectric layer had been removed by RIE etching.

Examples 2-3

Procedure for Seeding a Tool With NovaCentrix Conductive Ink

Conductive silver ink was applied to the top of the ribs on a structured nickel tool by hand printing. The nickel tool had a hexagonal portion and a triangular portion (e.g., corresponding to a busbar portion). The hexagonal portion included hexagons having a width across opposing parallel sides of 1 mm, a rib width of 25 micrometers, and a rib height of 25 micrometers. The triangular portion included hexagons have the same geometry of the hexagonal portion and included additional ribs extending from each vertex of the hexagon to a center of the hexagon. The conductive silver ink was applied as follows:

(1) A continuous layer of NovaCentrix (Round Rock, TX) DSPI-420 Silver Dispersing Ink was prepared as an ink source by coating it onto PET film with a #5 Mayer Rod, producing a wet film thickness of approximately 10 μm.

(2) A flat photopolymer flexographic printing plate, was mounted to a ~4 inch diameter mandrel with 3M E1120 CUSHION-MOUNT tape (available from 3M Company, St. Paul, MN), was immediately hand rolled over the coating of (1), transferring a portion of silver ink to the surface of the flexographic printing plate before drying.

(3) The flexographic printing plate of (2) was then immediately hand-rolled over the surface of the nickel tool, transferring silver ink only to the upper relief surface of the structured nickel tool, before the silver ink dried on the printing plate surface.

The silver ink was then dried and sintered for at least 2 minutes at 240° F., using a Despatch (Minneapolis, MN) solvent-rated oven (Model LFC1-38-1).

Procedure for Film Formation

Equipment used in the process included a Fusion UV Processor run at ~10 ft/min, curing with an H-bulb, ChemInstruments (Chester Township, OH) laminator (Model: Hot Roll Laminator), and 5 mil PET film with both sides primed.

To initiate the process, PET film was cut into approximately 6.5 in. by 7.5 in. (16.5 cm by 19.1 cm) pieces to cover the entire surface of the tool. The UV processor was turned on following the instruction manual with lamp at normal setting and the conveyor belt speed of 50 RPM. Nitrogen gas was also supplied to the UV processor to assist the curing process.

Using a plastic transfer pipette, the UV Curable Resin was dispensed on the edge of the tool. The PET film was placed on top of the tool, which was held in place by taping one end to the tool. The sample was processed through a laminator which spread the resin uniformly across the tool.

The sample was then run through the UV processor twice to ensure that the resin cure to completion. The sample was removed from the tool by gently pulling the samples away at a 90° angle. The resultant film was a reverse image microstructure from the tool, with sintered silver seed layers at the bottom of the grooves.

Procedure for Copper Plating

The replicated film described above was put into an acidic copper plating solution composed of copper sulfate and sulfuric acid. The solution flow rate was 80 liter/minute. The plating was conducted with a power supply made by DYNATRONIX (Amery WI), Model CRS12-200, in a potentiostatic mode. The solution temperature was 21° C. The plating was controlled at 1.4V for 12.5 min and 10 min, respectively, for Examples 2 and 3. After the plating, the part was rinsed, dried, and examined under microscopy. It was confirmed that copper was plated onto the seed layers in the groove to form a micropattern of conductive traces.

For Example 2: In the hexagonal portion, the traces extended above the top surface of the UV cured layer by approximately 15 to 22 micrometers. In the triangular portion, the tops of the traces were approximately level with the top surface of the UV cured layer.

For Example 3: In the hexagonal portion, the tops of the traces were approximately level with the top surface of the UV cured layer by about 20 micrometers. In the triangular portion, the tops of the traces recessed by approximately 15 to 21 micrometers from the top surface of the UV cured layer.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A patterned conductive article comprising:
a substrate comprising a first groove therein, the first groove having a bottom surface and side surfaces;
a conductive seed layer disposed in the first groove; and
a unitary conductive body disposed at least partially in the first groove,
wherein the conductive seed layer covers at least a majority of the bottom surface of the first groove, and the unitary conductive body covers the conductive seed layer and at least a majority of the side surfaces of the first groove, and wherein in a plane through the unitary conductive body that is parallel to and separate from the conductive seed layer, the unitary conductive body has a first line edge roughness at a first interface with the side surfaces, and the conductive seed layer has a second line edge roughness at an edge of the conductive seed layer, the conductive seed layer defining therein a plurality of fractures extending from an edge of the conductive seed layer to an interior region of the conductive seed layer, the fractures causing the second line edge roughness to be greater than the first line edge roughness.

2. The patterned conductive article of claim 1, wherein the conductive seed layer and the unitary conductive body defines a conductive trace extending along a longitudinal direction of the conductive trace, the conductive trace having a width W along a width direction orthogonal to the longitudinal direction and to a thickness direction of the substrate and having a thickness T along the thickness direction, T/W being at least 0.8.

3. The patterned conductive article of claim 2, wherein T/W is at least 2.

4. The patterned conductive article of claim 2, wherein T/W is at least 5.

5. The patterned conductive article of claim 1, wherein the substrate comprises a micropattern of grooves therein, the micropattern of grooves comprising the first groove.

6. The patterned conductive article of claim 5 comprising a micropattern of conductive traces disposed at least partially in the micropattern of grooves, the micropattern of conductive traces comprising the conductive seed layer and the unitary conductive body.

7. The patterned conductive article of claim 1 having an average optical transmittance for normally incident light in a wavelength range of 400 nm to 700 nm of at least 80%.

8. The patterned conductive article of claim 1, wherein the conductive seed layer comprises a monolithic metal layer.

9. A patterned conductive article comprising:
a substrate comprising a first groove therein, the first groove having a bottom surface and side surfaces; and
a conductive seed layer disposed in the first groove and covering at least a majority of the bottom surface of the first groove, the conductive seed layer defining therein a plurality of fractures extending from an edge of the conductive seed layer to an interior region of the conductive seed layer.

10. The patterned conductive article of claim 9, wherein the substrate comprises a micropattern of grooves therein, the micropattern of grooves comprising the first groove.

11. The patterned conductive article of claim 9 further comprising a unitary conductive body disposed at least partially in the first groove and covering the conductive seed layer and at least a majority of the side surfaces of the first groove.

12. The patterned conductive article of claim 11, wherein in a plane through the unitary conductive body that is parallel to and separate from the conductive seed layer, the unitary conductive body has a lower first line edge roughness at a first interface with the side surfaces, and the conductive seed layer has a higher second line edge roughness at an edge of the conductive seed layer.

13. The patterned conductive article of claim 11, wherein the conductive seed layer and the unitary conductive body defines a conductive trace extending along a longitudinal direction of the conductive trace, the conductive trace having a width W along a width direction orthogonal to the longitudinal direction and to a thickness direction of the substrate and having a thickness T along the thickness direction, T/W being at least 0.8.

14. The patterned conductive article of claim 13, wherein T/W is at least 2.

15. The patterned conductive article of claim 13, wherein T/W is at least 5.

16. The patterned conductive article of claim 11, wherein the substrate comprises a micropattern of grooves therein, the micropattern of grooves comprising the first groove, the patterned conductive article comprising a micropattern of conductive traces disposed at least partially in the micropattern of grooves, the micropattern of conductive traces comprising the conductive seed layer and the unitary conductive body.

17. The patterned conductive article of claim 9 having an average optical transmittance for normally incident light in a wavelength range of 400 nm to 700 nm of at least 80%.

18. The patterned conductive article of claim 9, wherein the conductive seed layer comprises a monolithic metal layer.

* * * * *